(12) United States Patent
Pai et al.

(10) Patent No.: US 11,039,554 B2
(45) Date of Patent: Jun. 15, 2021

(54) ELECTRONIC APPARATUS WITH A TEMPERATURE SENSOR

(71) Applicant: Wiwynn Corporation, New Taipei (TW)

(72) Inventors: Ting-Yu Pai, New Taipei (TW); Yao-Sheng Huang, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/202,097

(22) Filed: Nov. 28, 2018

(65) Prior Publication Data

US 2020/0060047 A1 Feb. 20, 2020

(30) Foreign Application Priority Data

Aug. 16, 2018 (TW) .................................. 107128554

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/20154* (2013.01); *H05K 7/20727* (2013.01); *G06F 1/20* (2013.01); *G06F 2200/201* (2013.01); *H05K 7/20209* (2013.01)

(58) Field of Classification Search
CPC ........... H05K 7/20836; H05K 7/20154; H05K 7/20727; H05K 7/20209; G06F 1/206; G06F 1/20; G06F 2200/201
See application file for complete search history.

(56) References Cited

U.S. PATENT DOCUMENTS

| 4,604,753 | A | * | 8/1986 | Sawai | H01S 5/02415 372/29.01 |
| 4,689,659 | A | * | 8/1987 | Watanabe | H01L 27/0211 257/469 |
| 4,982,143 | A | * | 1/1991 | Gerschner | H02H 6/00 318/434 |
| 5,482,793 | A | * | 1/1996 | Burns | H01M 10/486 320/150 |
| 5,911,897 | A | * | 6/1999 | Hamilton | G01R 31/2874 219/209 |
| 6,020,820 | A | * | 2/2000 | Chiang | H01L 23/34 257/E23.08 |
| 6,203,191 | B1 | * | 3/2001 | Mongan | G01K 7/42 374/20 |

(Continued)

FOREIGN PATENT DOCUMENTS

| CN | 201174855 Y | 12/2008 |
| CN | 101377423 | 3/2009 |

(Continued)

*Primary Examiner* — Stephen S Sul
*Assistant Examiner* — Michael A Matey
(74) *Attorney, Agent, or Firm* — Winston Hsu

(57) ABSTRACT

An electronic apparatus includes an airflow generation device and a passive component. The passive component is a temperature sensor and includes a component body and a heat sink attached to the component body. The heat sink can absorb environmental heat which is dissipated through the air flow. The airflow generation device operates according to a sensing result by the passive component.

8 Claims, 10 Drawing Sheets

(56) References Cited

U.S. PATENT DOCUMENTS

| | | | | |
|---|---|---|---|---|
| 6,477,047 B1* | 11/2002 | Markwardt | ............ | H01L 23/34 165/80.3 |
| 7,532,452 B2* | 5/2009 | Pohlink | ................ | G01R 15/16 361/274.1 |
| 9,750,128 B2* | 8/2017 | Endo | .................... | H05K 1/0203 |
| 10,338,016 B1* | 7/2019 | Callister | .............. | G01N 33/202 |
| 2004/0264114 A1* | 12/2004 | Hachiya | ................. | G06F 1/203 361/676 |
| 2005/0036291 A1* | 2/2005 | Huang | ............... | H01L 21/4882 361/704 |
| 2005/0047094 A1* | 3/2005 | Hsu | ...................... | H01L 23/367 361/704 |
| 2005/0206368 A1* | 9/2005 | Lopez | ................ | G01R 31/2863 324/750.07 |
| 2007/0017686 A1* | 1/2007 | Numata | ............... | H01L 23/367 174/17 VA |
| 2007/0222046 A1* | 9/2007 | Tokunaga | .............. | H01L 23/34 257/678 |
| 2009/0168374 A1* | 7/2009 | Clayton | ................ | H05K 1/189 361/749 |
| 2009/0213549 A1* | 8/2009 | Guo | ..................... | H01L 23/367 361/704 |
| 2010/0254426 A1* | 10/2010 | Okamoto | ................ | H01L 23/34 374/141 |
| 2011/0155360 A1* | 6/2011 | Liu | ..................... | H01L 23/3675 165/185 |
| 2011/0174978 A1* | 7/2011 | Forg | ......................... | G01J 5/02 250/338.3 |
| 2013/0077331 A1* | 3/2013 | Hessling | ................ | B64D 47/06 362/470 |
| 2015/0082811 A1* | 3/2015 | Rangarajan | ............ | F25B 21/02 62/3.7 |
| 2017/0125998 A1* | 5/2017 | Tiziani | ..................... | G01K 1/14 |
| 2018/0348828 A1* | 12/2018 | Cavallaro | ........... | H04M 1/0254 |
| 2019/0116297 A1* | 4/2019 | Youmans | .............. | H04N 5/2252 |
| 2019/0265105 A1* | 8/2019 | Simon | ................ | G01N 21/3504 |

FOREIGN PATENT DOCUMENTS

| | | |
|---|---|---|
| CN | 102355148 A | 2/2012 |
| CN | 106502355 A | 3/2017 |
| TW | 201135177 A1 | 10/2011 |
| TW | 201249316 A1 | 12/2012 |
| TW | I562146 | 12/2016 |

* cited by examiner

US 11,039,554 B2

ELECTRONIC APPARATUS WITH A TEMPERATURE SENSOR

BACKGROUND OF THE INVENTION

1. Field of the Invention

The present disclosure relates to an electronic apparatus, and more particularly to a passive component used in an electronic apparatus.

2. Description of the Prior Art

As cloud applications develop, the demand for the performance of various electronic apparatus is increasing. The heat-dissipation efficiency of the systems is required to be increased as well. In general, in order for required heat-dissipation efficiency, the system will control the rotation speed of fans according to a temperature sensed by a temperature sensor. However, the current temperature sensors may produce inaccurate sensing results due to a heat collecting effect that occurs when the system airflow is low, which influences the heat-dissipation efficiency of the system.

SUMMARY OF THE INVENTION

The present disclosure provides a passive component used in an electronic apparatus. The passive component includes a heat sink for reducing the difference in temperature between the passive component and the environment.

A passive component used in an electronic apparatus according to an embodiment is a temperature sensor and includes a component body and a heat sink. The heat sink is attached onto the component body. The heat sink is thermally coupled to the component body. Thereby, the heat sink can absorb environmental heat (including heat from the component body) and also can dissipate heat through airflow, so that the difference between the temperature of the component body and the temperature outside the component body (i.e. the temperature of the environment where the component body is located) is reduced. In other words, the influence of the heat collecting effect on the passive component is greatly reduced.

The present disclosure also provides an electronic apparatus. The electronic apparatus includes a passive component. The passive component includes a heat sink for reducing the difference in temperature between the passive component and the environment.

An electronic apparatus according to an embodiment includes an airflow generation device and a passive component. The airflow generation device operates according to a sensing result of the passive component. The passive component is a temperature sensor and includes a component body and a heat sink. The heat sink is attached onto the component body. The heat sink is thermally coupled to the component body. Thereby, the heat sink can absorb environmental heat (including heat from the component body) and also can dissipate heat through airflow, so that the difference between the temperature of the component body and the temperature outside the component body (i.e. the temperature of the environment where the component body is located) is reduced.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
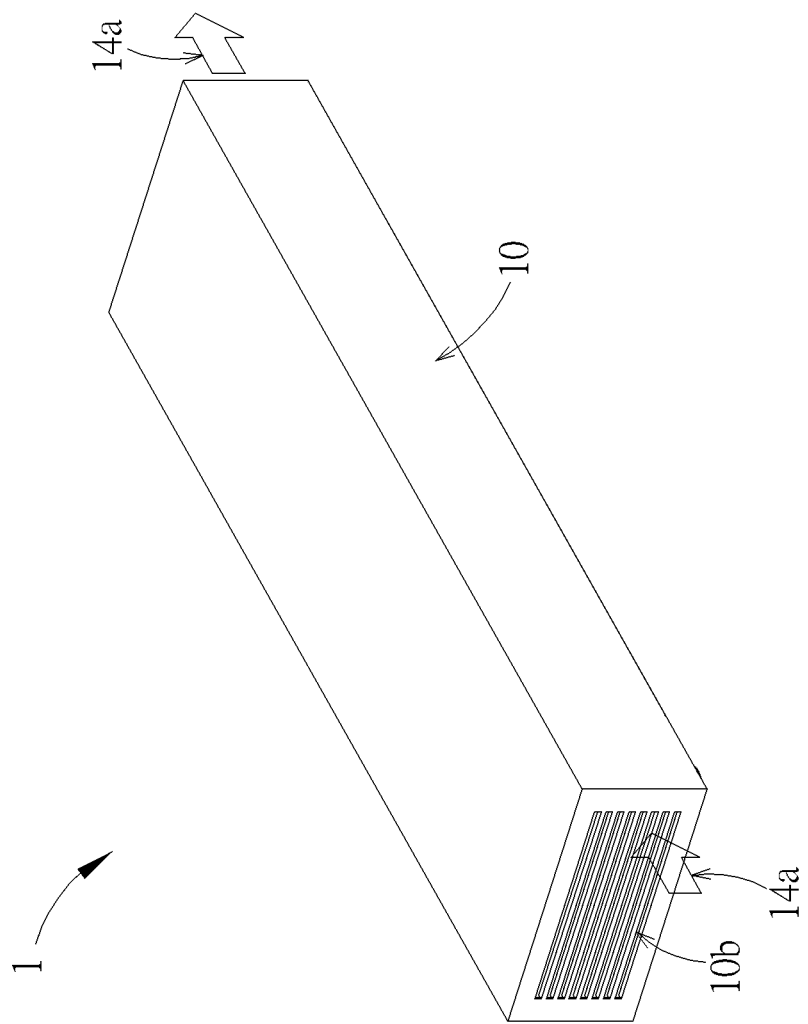
FIG. 1 is a schematic diagram illustrating an electronic apparatus according to an embodiment.
Figure 2:
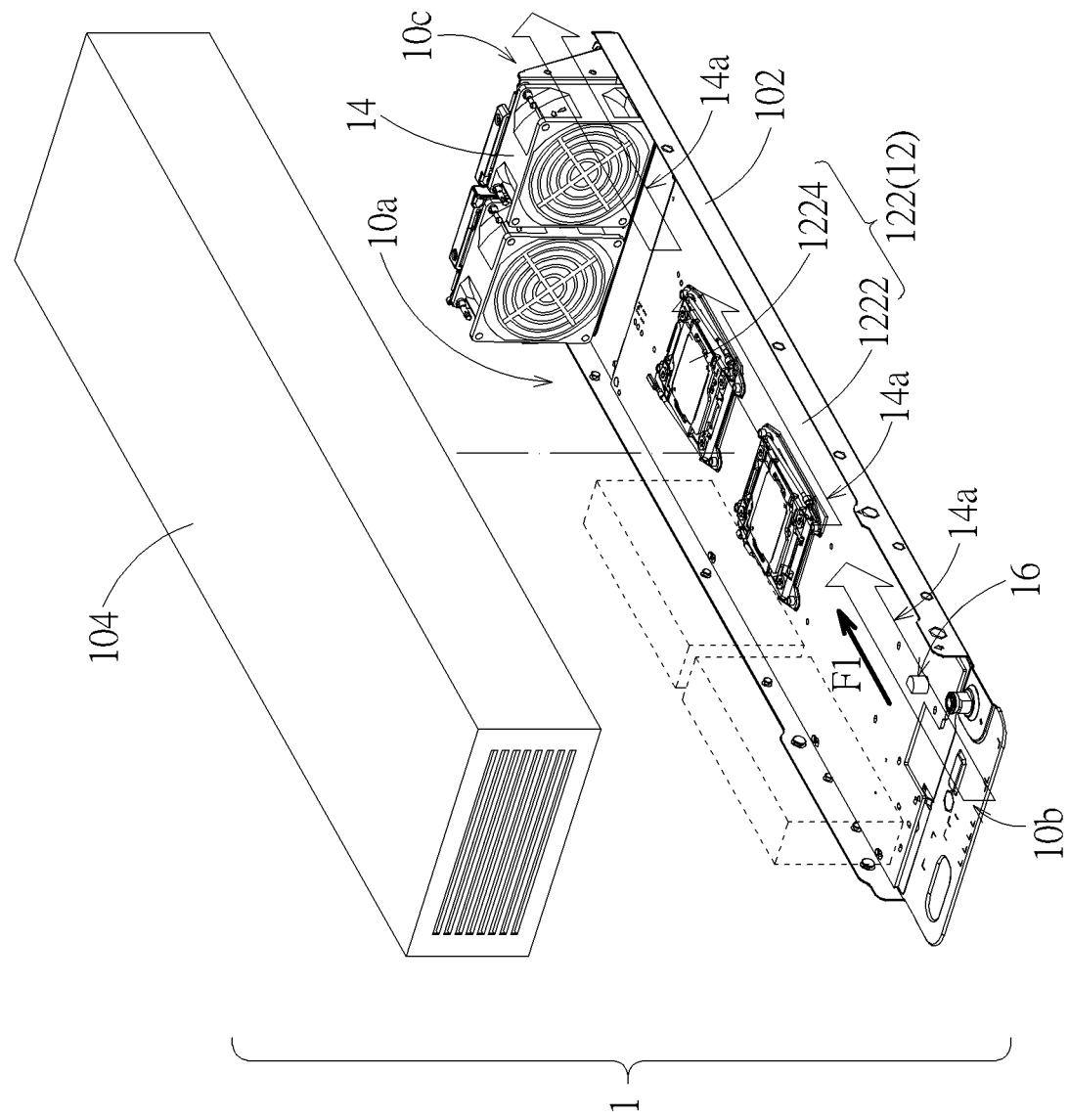
FIG. 2 is a partially exploded view of the electronic apparatus in FIG. 1.

Please refer to FIG. 1 and FIG. 2. An electronic apparatus 1 (for example but not limited to a server, a computer and so on) according to an embodiment includes a casing 10, an electronic system module 12, an airflow generation device 14, and a passive component 16. The casing 10 includes a bottom plate 102 and a frame 104. The bottom plate 102 and the frame 104 are engaged with each other to form an accommodating space 10a. The casing 10 has an air inlet 10b and an air outlet 10c. The accommodating space 10a communicates with the outside of the casing 10 through the air inlet 10b and the air outlet 10c. In the embodiment, one end of the bottom plate 102 and the frame 104 forms the air inlet 10b, and another end thereof forms the air outlet 10c. The electronic system module 12 is disposed in the accommodating space 10a of the casing 10. In the embodiment, the electronic system module 12 is disposed on the bottom plate 102 and includes a system main board 122 and other electronic components (shown by rectangular solids in FIG. 1) electrically connected to the system main board 122. For example, the system main board 122 includes a circuit board 1222, a processor 1224 on the circuit board 1222, and other electronic components (e.g. memories, connectors, and so on, which are not shown in the figures) required for operation. The other electronic components may include a power supply, storage, communication interface, and so on (depending on the function of the electronic apparatus 1). In practice, the electronic system module 12 can be realized by several circuit board modules. Each circuit board module can include a circuit board and other electronic components (e.g. processor, memory, connector, and so on) disposed thereon and required for operation.

Furthermore, the airflow generation device 14 is installed to the casing 10 and is electrically connected to the electronic system module 12. The electronic system module 12 controls the airflow generation device 14 to generate an airflow 14a (indicated by a hollow arrow in the figures). In the embodiment, the airflow generation device 14 includes an axial fan for generating the airflow 14a. The air inlet 10b and the air outlet 10c are located at two opposite sides of the casing 10. The axial fan is disposed in the accommodating space 10a of the casing 10 near the air outlet 10c. The airflow 14a enters the casing 10 (or the accommodating space 10a) from the outside of the casing 10 through the air inlet 10b (e.g. get in the accommodating space 10a), and flows out of the casing 10 through the air outlet 10c. That is, the airflow 14a flows through the air inlet 10b, the accommodating space 10a, the axial fan, and the air outlet 10c. The airflow 14a is primarily used for enhancing the heat convection efficiency of a heat dissipation mechanism of the electronic apparatus 1. In practice, the flowing path of the airflow 14a in the accommodating space 10a can depend on the actual demand. For example, a guiding structure is used for guiding the airflow 14a. For simplification of the description, in the embodiment, the flowing path of the airflow 14a is substantially a straight line. Furthermore, in practice, the axial fan can be disposed near to the air inlet 10b instead, or outside the casing 10, or disposed at any location on the flowing path of the airflow 14a, which also can generate the airflow 14a in principle. Furthermore, in practice, the airflow generation device 14 can include another fan of different types, e.g. a centrifugal fan, or include more fans to generate the airflow 14a together.

The passive component 16 is disposed on the system main board 122 and electrically connected to the electronic system module 12. The electronic system module 12 can control the operation of the passive component 16 for a specific function. The passive component 16 includes a component body 162, a plurality of pins 164, and a heat sink 166. The component body 162 is located on the flowing path of the airflow 14a. The plurality of pins 164 are exposed out of the component body 162. The passive component 16 is electrically connected onto the system main board 122 of the electronic system module 12 through the plurality of pins 164. The heat sink 166 is attached to the component body 162. The actual structure of the component body 162 depends on the function of the passive component 16. In general, the component body 162 may include a component circuit and a housing (for example but not limited to an insulation casing, e.g. by plastic insert molding) enclosing the component circuit. The plurality of pins 164 are connected to the component circuit and protrude out of the housing. The passive component 16 performs its function through the component circuit. In the embodiment, the passive component 16 is a temperature sensor which is disposed in the accommodating space 10a of the casing 10 and located on the flowing path of the airflow 14a. Thereby, the electronic system module 12 can sense a temperature of the airflow 14a through passive component 16 and control the airflow generation device 14 to generate the airflow 14a according to the sensed temperature, e.g. by controlling the rotation speed of the axial fan, i.e. controlling the flow rate of the airflow 14a. In other words, the airflow generation device 14 operates according to a sensing result of the passive component 16. The sensing result is the sensed temperature in the embodiment. Furthermore, in the embodiment, the plurality of pins 164 are realized by insertion pins, so that the passive component 16 can be fixed on the system main board 122 by an inserting way. In practice, the plurality of pins 164 can be realized by solder pads instead, so that the passive component 16 can be fixed on the system main board 122 by a surface mounting way. Furthermore, the component body 162 is disposed near the air inlet 10b, so the temperature sensed by the passive component 16 is equivalent to the temperature entering the casing 10 (i.e. equivalent to the temperature of the airflow 14a at the air inlet 10b).

Figure 3:
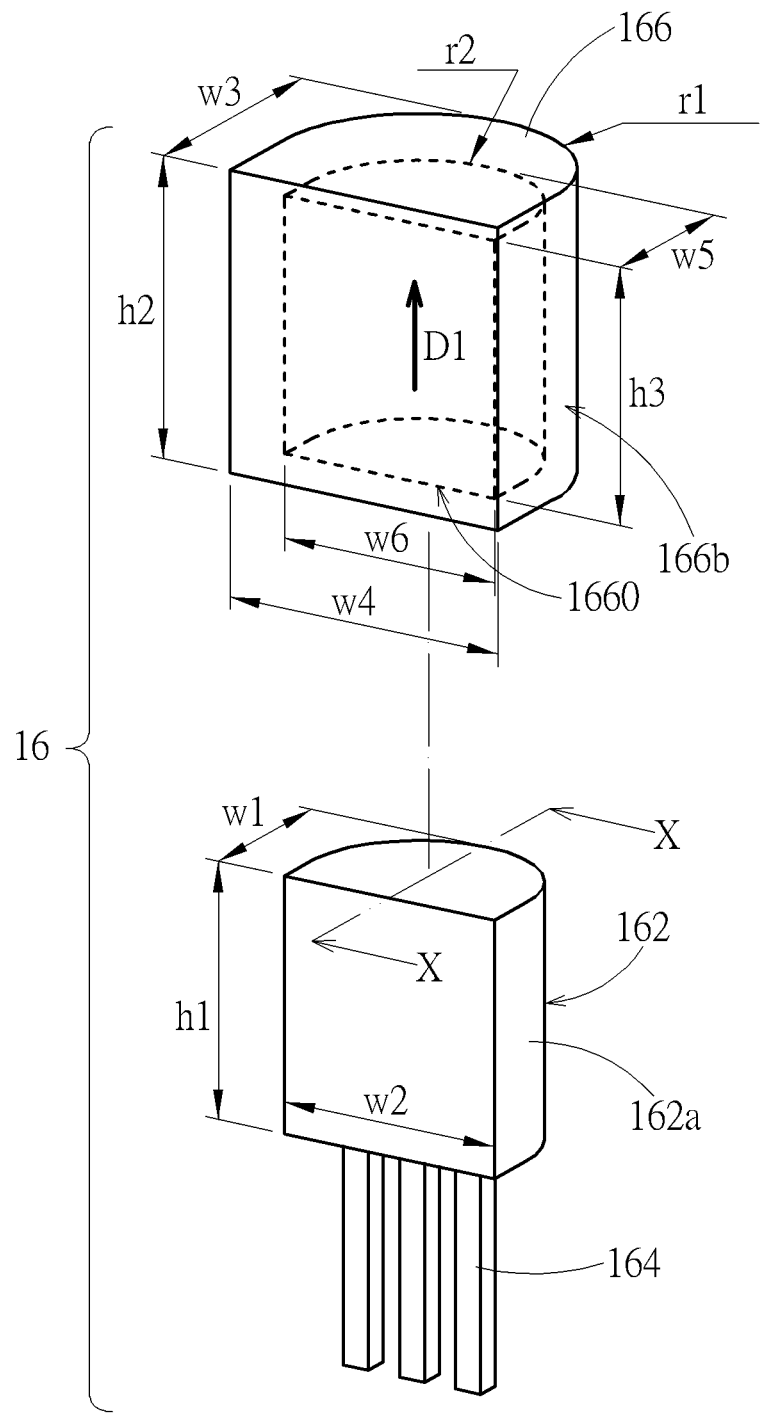
FIG. 3 is a partially exploded view of a passive component of the electronic apparatus in FIG. 2.
Figure 4:
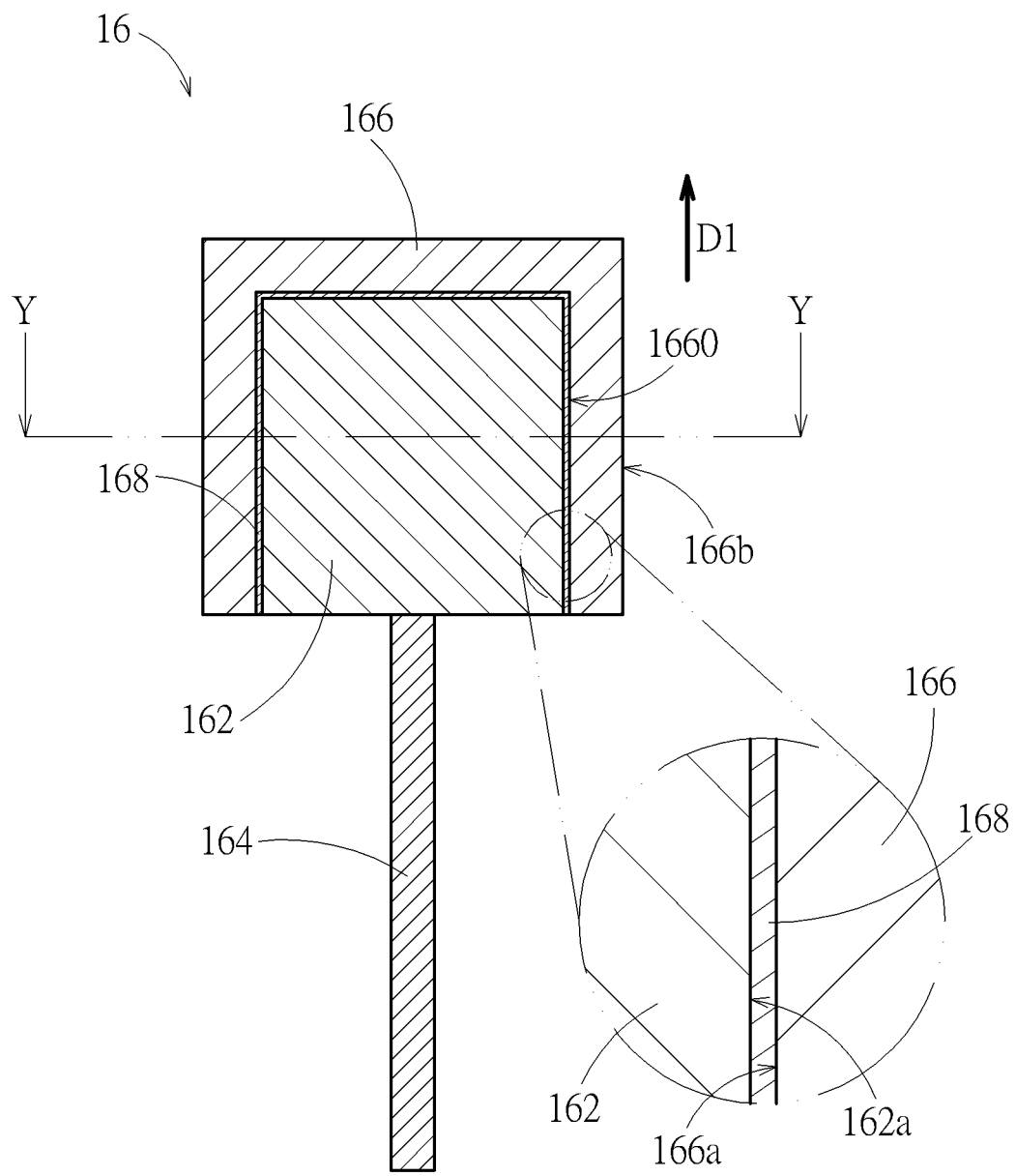
FIG. 4 is a sectional view of the passive component of the electronic apparatus in FIG. 2, of which the cutting plane can refer to the line X-X in FIG. 3, and in which a component body of the passive component is shown in a single structure for drawing simplification.

Please refer to FIG. 3 and FIG. 4. The heat sink 166 has an accommodating space 1660 (shown in hidden lines in FIG. 3). The component body 162 is accommodated in the accommodating space 1660 and is thermally coupled with the inner surface 166a of the accommodating space 1660. In the embodiment, the gap between the outer surface 162a of the component body 162 and the inner surface 166a of the accommodating space 1660 is filled with a thermal conductive material 168 (only shown in FIG. 4, for example but not limited to a colloid containing metals, metal oxides, silicon oxides, or ceramic particles) for realizing the thermally coupling between the component body 162 and the heat sink 166; however it is not limited thereto in practice. For example, the outer surface 162a of the component body 162 and the inner surface 166a of the accommodating space 1660 have enough contact area therebetween (e.g. by fixing the heat sink 166 on the component body 162 by an interference fit), which also can perform a nice thermally coupling without filling with the thermal conductive material 168. In addition, the profile of the component body 162 and the profile of the accommodating space 1660 are not limited to the same or completely similar. The component body 162 is not limited to be completely accommodated inside the accommodating space 1660. Basically, the thermally coupling between the component body 162 and the heat sink 166 belongs to heat conduction. In addition, in the embodiment, for the component body 162, the structural diameter h1 is 4.83 mm, the structural diameter w1 is 3.7 mm, and the structural diameter w2 is 4.83 mm. For the heat sink 166, the structural diameter h2 is 7 mm, the structural diameter w3 is 5.71 mm, the structural diameter w4 is 6.84 mm, the structural diameter r1 is 3.42 mm, the structural diameter h3 is 5 mm, the structural diameter w5 is 3.9 mm, the structural diameter w6 is 5 mm, and the structural diameter r2 is 3.02 mm. However it is not limited thereto in practice.

Figure 5:
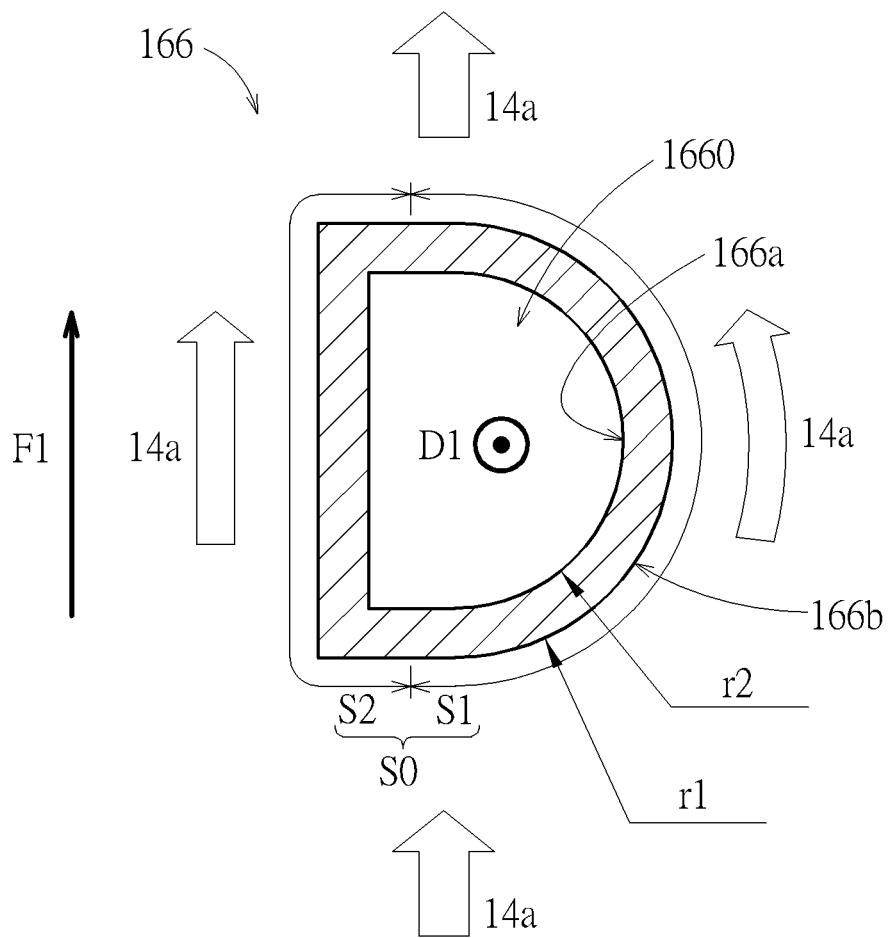
FIG. 5 is a sectional view of a heat sink of the passive component of the electronic apparatus in FIG. 2, of which the cutting plane can refer to the line Y-Y in FIG. 4.

Furthermore, in the embodiment, the heat sink 166 has an outer periphery surface 166b. The outer periphery surface 166b extends in a first direction D1. Please also refer to FIG. 5. A sectional profile S0 of the outer periphery surface 166b on a plane (i.e. the drawing plan of FIG. 5) perpendicular to the first direction D1 includes a first profile section S1 and a second profile section S2. The first profile section S1 and the second profile section S2 are connected with each other to form the sectional profile S0. The length of the first profile section S1 is larger than the length of the second profile section S2. In the embodiment, the outer periphery surface 166b is disposed perpendicular to a flowing direction F1 (indicated by an arrow in FIG. 5) of the airflow 14a (indicated by hollow arrows in FIG. 5) which flows through the heat sink 166. The first profile section S1 and the second profile section S2 are defined at two sides of the flowing direction of the airflow 14a. The plane where sectional profile S0 is located is parallel to the flowing direction F1. The sectional profile S0 is asymmetric relative to the flowing direction F1, so the path lengths along which the airflow 14a flows by the two sides of the heat sink 166 are different. According to Bernoulli's principle, the difference in length can make the airflow 14a produce turbulence when leaving the heat sink 166, so as to enhance the heat-dissipation efficiency of the airflow 14a to the heat sink 166. However, it is not limited thereto. For example, even if the sectional profile S0 is symmetric relative to the flowing direction F1 (e.g. the outer periphery surface 166b is a cylindrical surface), the airflow 14a still can perform heat dissipation to the heat sink 166. In addition, in practice, the outer periphery surface 166b can be disposed obliquely (i.e. the first direction D1 is not perpendicular to the flowing direction F1). In this case, the sectional profile of the outer periphery surface 166b on a plane parallel to the flowing direction F1 still is asymmetric relative to the flowing direction F1, which still can produce turbulence to enhance the heat-dissipation efficiency.

In the embodiment, the thermal conductivity of the heat sink 166 is larger than the thermal conductivity of the component body 162, so the heat sink 166 can absorb environmental heat (including heat from the outside of the passive component 16 and heat from the component body 162), which can reduce the influence of the heat collecting effect on the component body 162 greatly, so that the component body 162 still can work as expected under an environment condition that the temperature difference between the component body 162 and the outside of the passive component 16 is not much. In another aspect, the heat sink 166 increases the exchange efficiency of heat between the passive component 16 and the airflow 14a, so that the temperature difference between the interior of the component body 162 and the outside the passive component 16 is not much. In practice, the heat sink 166 can be made of metal materials, e.g. copper, aluminum, and so on. Therefore, in the embodiment, the temperature sensed by the electronic system module 12 through the passive component 16 is much close to the actual temperature of the airflow 14a. In principle, the difference between the temperature sensed by the electronic system module 12 through the passive component 16 and the actual temperature of the airflow 14a can be reduced to be within a tolerance (e.g. 1 or 0.5 degree Celsius).

Figure 6:
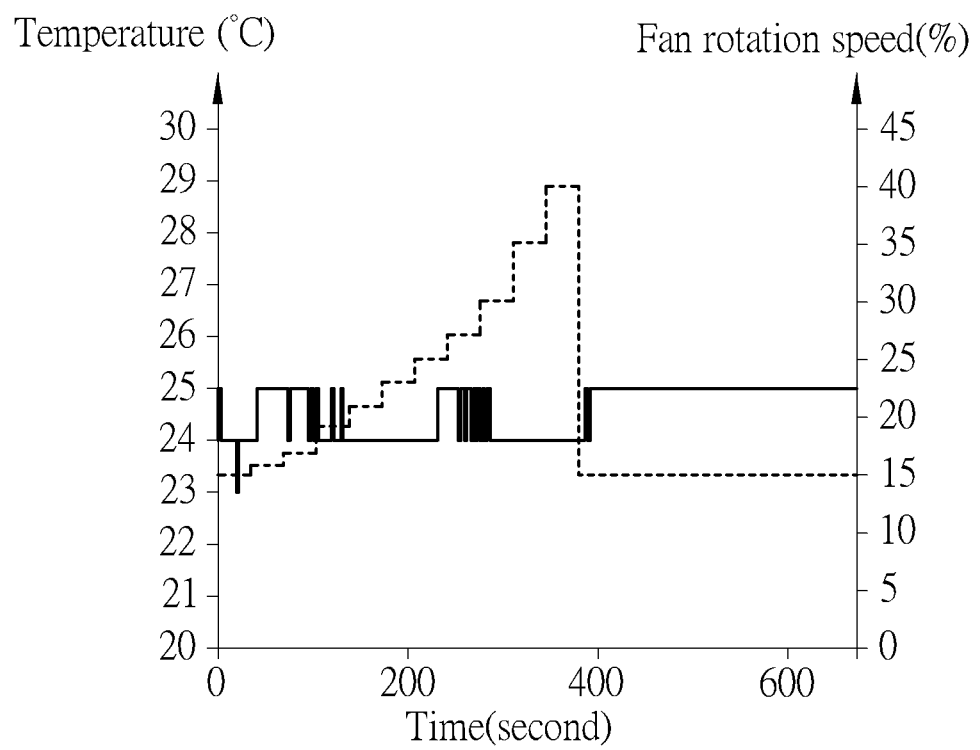
FIG. 6 is a diagram illustrating two variation curves of sensed temperature by the passive component and rotation speed of a fan of an airflow generation device to time respectively.
Figure 7:
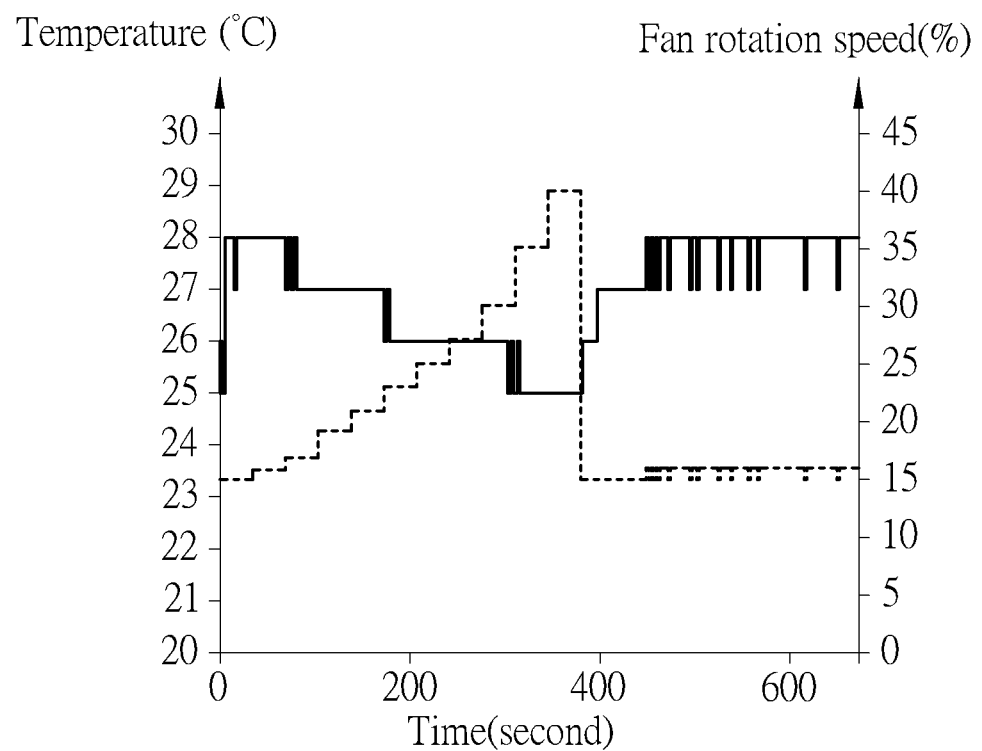
FIG. 7 is a diagram illustrating two variation curves of sensed temperature by a passive component without a heat sink and rotation speed of a fan of an airflow generation device to time respectively.

As shown by FIG. 6, in an actual application, when the airflow generation device 14 operates in a stable state (e.g. after about 400 seconds), the difference between the sensed temperature of the passive component 16 and the environment temperature (i.e. 24.5 degrees Celsius in this application) is about 0.5 degree Celsius. Therein, the airflow generation device 14 is expressed as a percentage of a rated fan rotation speed. The airflow generation device 14 operates at 15% of the rated fan rotation speed, which is shown in dashed line in the figure. As shown by FIG. 7, if the heat sink 166 is detached from the passive component 16, when the airflow generation device 14 operates in a stable state (e.g. after about 400 seconds), the difference between the sensed temperature of the passive component 16 and the environment temperature (i.e. 24.5 degrees Celsius in this application) is about 3.5 degrees Celsius. Therein, after 1300 seconds, the rotation speed of the airflow generation device 14 still varies, and the sensed temperature of the passive component 16 also varies. For simplification of the description, the airflow generation device 14 is regarded as operating at 16% of the rated fan rotation speed. The temperature sensed by the passive component 16 is regarded as 28 degrees Celsius. By a comparison of FIG. 6 with FIG. 7, the airflow generation device 14 can be regarded as operating at a low-speed state for both cases. It is obvious that the sensing accuracy of the passive component 16 is improved due to the heat sink 166.

In addition, in the embodiment, the heat sink 166 has a blind hole forming the accommodating space 1660; however, it is not limited thereto in practice. For example, the heat sink 166 can be realized by a tube. The hollow portion of the tube (i.e. the through hole thereof) is taken as the accommodating space 1660. For another example, the heat sink 166 can be realized by a C-shaped structure. The C-shaped structure is attached onto the component body 162 by clamping; therein, the hollow portion of the C-shaped structure is taken as the accommodating space 1660. For another example, the heat sink 166 can be realized by a plate or an L-shaped structure and is attached onto the component body 162 through thermal grease or other fixing parts, which also can reduce the influence of the heat collecting effect on the component body 162.

Figure 8:
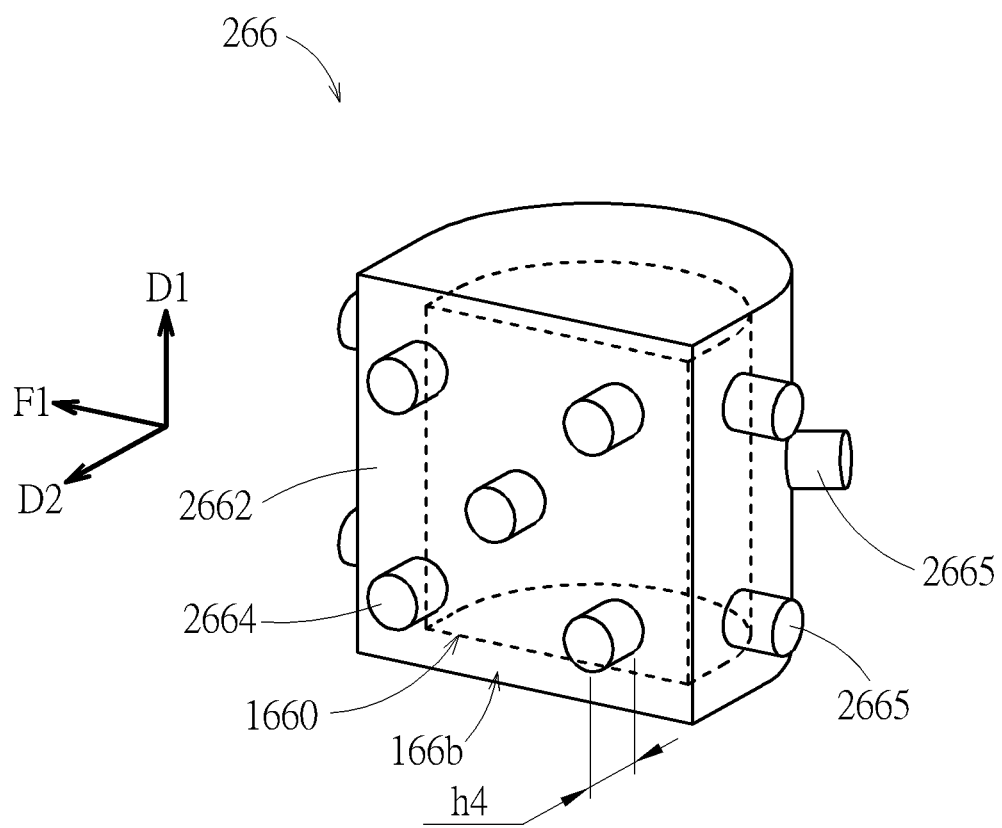
FIG. 8 is a schematic diagram illustrating a heat sink according to another embodiment.
Figure 9:
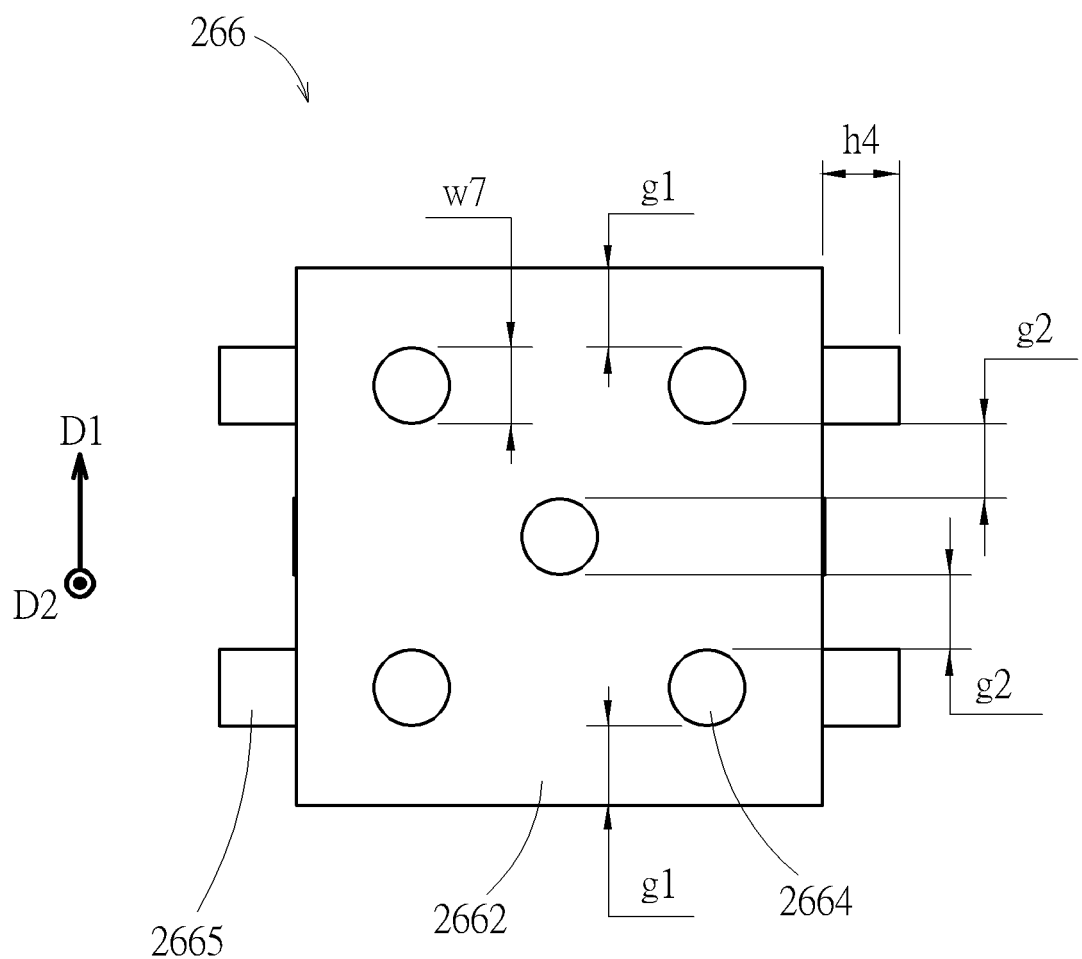
FIG. 9 is a front view of the heat sink in FIG. 8.

Furthermore, in practice, the heat-dissipation efficiency of the airflow 14a to the heat sink 166 can be enhanced by fins or by increasing the surface area of the outer periphery surface 166b. Please also refer to FIG. 8. A heat sink 266 of another embodiment in FIG. 8 has the same function as the heat sink 166, so that the heat sink 266 can replace the heat sink 166 to be used in the passive component 16. Compared with the heat sink 166, the heat sink 266 further includes a fin structure. For simplification of the description, the heat sink 266 uses the reference numbers of the heat sink 166 in principle. For other descriptions about the heat sink 266, please refer to the relevant descriptions of the heat sink 166, which will not be described in addition. The heat sink 266 includes a main body 2662 and a plurality of protrusive parts 2664. The main body 2662 forms an accommodating space 1660 (shown in hidden lines in FIG. 8). The main body 2662 sleeves on the component body 162, so that the heat sink 266 can be attached onto the component body 162. In structure, the main body 2662 is equivalent to the heat sink 166. The plurality of protrusive parts 2664 protrude outward from the outer periphery surface 166b of the main body 2662. In the embodiment, the protrusive part 2664 is a post. In structural logic, the post can be regarded as a rod fin. The post is not limited to a rod as shown in FIG. 8 in practice. The plurality of protrusive parts 2664 protrude out of the outer periphery surface 166b in a second direction D2. The second direction D2 is perpendicular to the first direction D1 and the flowing direction F1 (of the airflow 14a). The plurality of protrusive parts 2664 can be staggered or irregularly disposed so as to increase the probability of the airflow 14a generating turbulence when passing through the plurality of protrusive parts 2664, and enhance the heat-dissipation efficiency of the airflow 14a to the heat sink 266 as well. Furthermore, in the embodiment, the heat sink 266 also includes a plurality of protrusive parts 2665. Although the protrusive part 2665 does not extend perpendicular to the flowing direction F1, the protrusive part 2665 still can perform fin heat dissipation. Furthermore, in practice, the second direction D2 is not limited to be perpendicular to the first direction D1. Even when the protrusive part 2664 extends obliquely from the outer periphery surface 166b, the protrusive part 2664 still can perform fin heat dissipation. For example, the second direction D2 and the first direction D1 are non-parallel (i.e. forming an included angle). The protrusive part 2664 still can perform fin heat dissipation. Furthermore, in practice, the second direction D2 is not limited to be perpendicular to the flowing direction F1 (of the airflow 14a). For example, the second direction D2 and the flowing direction F1 are non-parallel (i.e. forming an included angle). The airflow 14a still can perform heat dissipation to the heat sink 266 through the protrusive parts 2664. In addition, in the embodiment, the heat sink 266 and the heat sink 166 are similar in structural dimensions; therefore, for other descriptions about the heat sink 266, please refer to the foregoing descriptions, which will not be described in addition. For simplification of the description, the protrusive parts 2664 and 2665 have the same structural dimensions; however, it is not limited thereto in practice. In the embodiment, the distribution of the protrusive parts 2664 of the heat sink 266 on the outer periphery surface 166b is shown as FIG. 9. Therein, FIG. 9 shows the plane of the outer periphery surface 166b perpendicular to the second direction D2. For the protrusive parts 2664 and 2665, the structural diameter h4 (i.e. the protruding height thereof) is 1 mm, and the structural diameter w7 (i.e. the rod diameter) is 1 mm. The distance g1 between the protrusive part 2664 and an edge of the plane is 1 mm, and the distance g2 between the protrusive parts 2664 is 1 mm. However, it is not limited thereto in practice.

Figure 10:
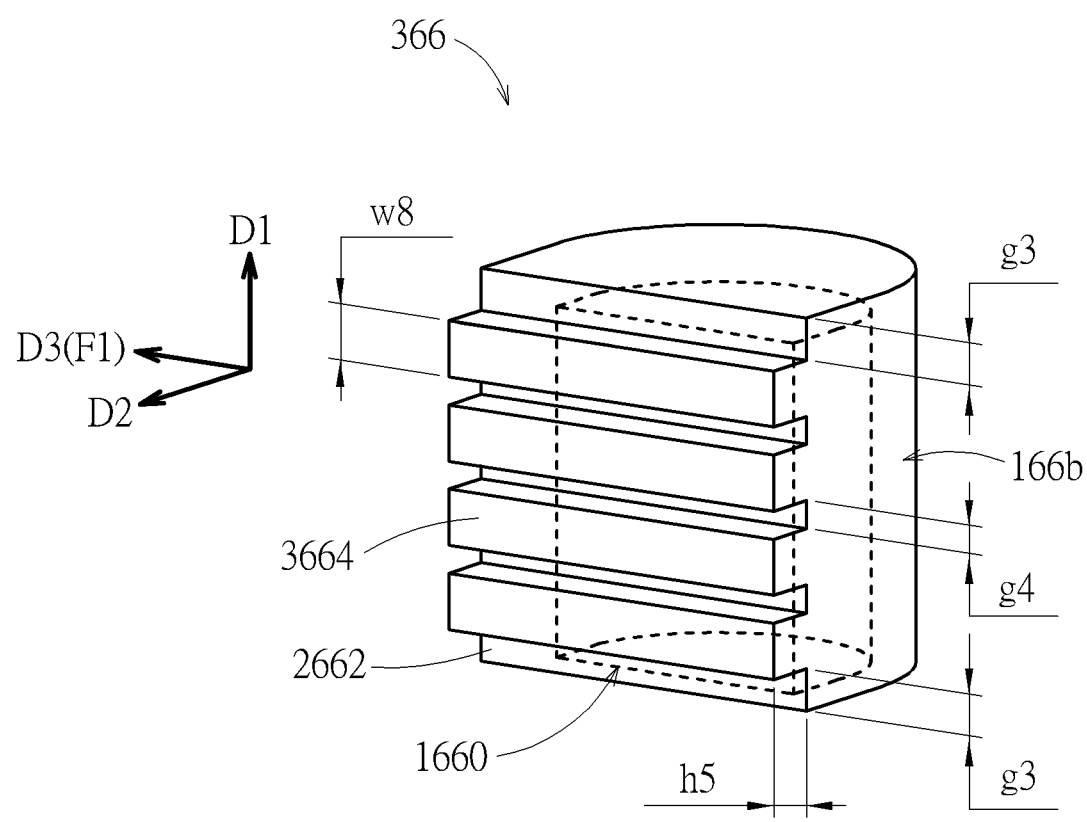
FIG. 10 is a schematic diagram illustrating a heat sink according to another embodiment.

Please also refer to FIG. 10. A heat sink 366 of another embodiment in FIG. 8 has the same function as the heat sink 266, so that the heat sink 266 also can replace the heat sink 166 to be used in the passive component 16. Compared with the heat sink 266, the fin structure of the heat sink 366 is provided in a plate form. For simplification of the description, the heat sink 366 uses the reference numbers of the heat sink 266 in principle. For other descriptions about the heat sink 366, please refer to the relevant descriptions of the heat sink 266, which will not be described in addition. Each protrusive part 3664 of the heat sink 366 is a plate fin. The protrusive parts 3664 extend in a third direction D3. In the embodiment, the third direction D3 and the flowing direction F1 (of the airflow 14a) are parallel, so that the airflow 14a can flow through the protrusive parts 3664 smoothly; however, it is not limited thereto in practice. For example, the third direction D3 and the flowing direction F1 form an acute angle therebetween. That is, the protrusive parts 3664 extend obliquely relative to the flowing direction F1, which still can perform fin heat dissipation. In addition, in the embodiment, the heat sink 366 and the heat sink 166 are similar in structural dimensions; therefore, for other descriptions about the heat sink 366, please refer to the foregoing descriptions, which will not be described in addition. For the protrusive part 3664, the structural diameter h5 (i.e. the protruding height thereof) is 1 mm, the structural diameter w8 (i.e. the width thereof) is 1 mm, the distance g3 between the protrusive part 3664 and an edge of the outer periphery surface 166b in the first direction D1 is 0.75 mm, and the distance g4 between the protrusive parts 3664 is 0.5 mm. However, it is not limited thereto in practice. Furthermore, in practice, the protrusive part 3664 is not limited to a plate with a uniform width. For example, the width thereof decreasingly varies in the second direction D2. In addition, the foregoing descriptions relevant to the structural variations of the protrusive part 2664 are also applicable herein, and will not be repeated in addition. Furthermore, in practice, fins on the heat sink can be provided in both forms mentioned above, even in other fin forms.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic apparatus, comprising:
    a temperature sensor, comprising a single component body and a single heat sink thermally and physically attached onto and enclosing the component body, the temperature sensor sensing a temperature through the component body, the heat sink having an outer periphery surface, the outer periphery surface extending in a first direction; and
    an airflow generation device, the airflow generation device operating according to a sensing result of the temperature sensor;
   wherein the temperature sensor is located on a flowing path of an airflow generated by the airflow generation device and senses a temperature of the airflow, the airflow flows by the temperature sensor in a flowing direction, a sectional profile of the outer periphery surface on a plane parallel to the flowing direction comprises a first profile section and a second profile section, the first profile section and the second profile section are connected with each other to form the sectional profile, the first profile section and the second profile section are located at two opposite sides of the heat sink in the flowing direction, and a length of the first profile section is larger than a length of the second profile section.

2. The electronic apparatus according to claim 1, wherein the heat sink has an accommodating space, and the component body is disposed in the accommodating space and thermally coupled with an inner surface of the accommodating space.

3. The electronic apparatus according to claim 2, wherein a gap between the component body and the inner surface of the accommodating space is filled with a thermal conductive material.

4. The electronic apparatus according to claim 2, wherein the heat sink comprises a main body and a plurality of protrusive parts, the main body forms the accommodating space and the outer periphery surface, and the plurality of protrusive parts protrude outward from the outer periphery surface.

5. The electronic apparatus according to claim 4, wherein the protrusive part is a post, the plurality of posts protrude out of the outer periphery surface in a second direction, and the second direction and the first direction are non-parallel.

6. The electronic apparatus according to claim 4, wherein the protrusive part is a plate fin, the plurality of plate fins protrude out of the outer periphery surface in a second direction and extend in a third direction, and the second direction and the third direction are non-parallel to the first direction.

7. The electronic apparatus according to claim 2, wherein the heat sink has a blind hole forming the accommodating space.

8. The electronic apparatus according to claim 1, further comprising a casing and an electronic system module, the electronic system module, the airflow generation device, and the temperature sensor are disposed in the casing, and the electronic system module is electrically connected with the airflow generation device and the temperature sensor.

* * * * *